US011251399B2

(12) United States Patent
Sun et al.

(10) Patent No.: US 11,251,399 B2
(45) Date of Patent: Feb. 15, 2022

(54) DISPLAY SUBSTRATE, DISPLAY APPARATUS, METHOD OF FABRICATING DISPLAY SUBSTRATE

(71) Applicant: BOE Technology Group Co., Ltd., Beijing (CN)

(72) Inventors: Zhongyuan Sun, Beijing (CN); Jingkai Ni, Beijing (CN); Jinxiang Xue, Beijing (CN); Guangcai Yuan, Beijing (CN); Wenqi Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 378 days.

(21) Appl. No.: 16/473,866

(22) PCT Filed: Oct. 10, 2018

(86) PCT No.: PCT/CN2018/109622
§ 371 (c)(1),
(2) Date: Jun. 26, 2019

(87) PCT Pub. No.: WO2020/073226
PCT Pub. Date: Apr. 16, 2020

(65) Prior Publication Data
US 2021/0336203 A1  Oct. 28, 2021

(51) Int. Cl.
*H01L 51/52* (2006.01)
*H01L 51/00* (2006.01)
(Continued)

(52) U.S. Cl.
CPC ...... *H01L 51/5253* (2013.01); *H01L 27/3258* (2013.01); *H01L 27/3276* (2013.01);
(Continued)

(58) Field of Classification Search
None
See application file for complete search history.

(56) References Cited

U.S. PATENT DOCUMENTS 10,056,574 B2  8/2018  Ishida et al.
10,910,590 B2 * 2/2021  Harikrishna Mohan .................. H01L 51/56
(Continued)

FOREIGN PATENT DOCUMENTS

CN  1520235 A   8/2004
CN  103943788 A  7/2014
(Continued)

OTHER PUBLICATIONS

Grant of Patent in the Korean Patent Application No. 20197018877 dated Nov. 30, 2020; English translation attached.
(Continued)

*Primary Examiner* — J. E. Schoenholtz
(74) *Attorney, Agent, or Firm* — Intellectual Valley Law, P.C.

(57) ABSTRACT

The present application provides a display substrate. The display substrate includes a base substrate; a crack barrier layer on the base substrate defining a plurality of crack barrier regions in the display substrate; and a plurality of encapsulated islands on the base substrate and respectively in the plurality of crack barrier regions. Each of the plurality of encapsulated islands includes at least one of a plurality of light emitting elements; and an encapsulating layer encapsulating the at least one of a plurality of light emitting elements and forming a lateral side of a respective one of the plurality of encapsulated islands. The crack barrier layer forms a barrier wall for preventing cracks in one or more sublayers of the display substrate outside the plurality of encapsulated islands from propagating into inside of each of the plurality of encapsulated islands.

19 Claims, 11 Drawing Sheets

(51) Int. Cl.
 *H01L 27/32* (2006.01)
 *H01L 51/56* (2006.01)
(52) U.S. Cl.
 CPC .......... *H01L 51/0097* (2013.01); *H01L 51/56* (2013.01); *H01L 2227/323* (2013.01); *H01L 2251/5338* (2013.01)

(56) References Cited

U.S. PATENT DOCUMENTS

| | | | |
|---|---|---|---|
| 2014/0217397 A1 | 8/2014 | Kwak et al. | |
| 2015/0280170 A1* | 10/2015 | Harikrishna Mohan | H01L 27/326 257/40 |
| 2015/0311260 A1 | 10/2015 | Senda et al. | |
| 2016/0240802 A1 | 8/2016 | Lee | |
| 2017/0012237 A1 | 1/2017 | Sun et al. | |
| 2017/0279057 A1 | 9/2017 | Park et al. | |
| 2018/0226604 A1 | 8/2018 | Gong et al. | |
| 2019/0181362 A1 | 6/2019 | Tian et al. | |
| 2019/0189729 A1 | 6/2019 | Zhang et al. | |
| 2021/0119175 A1* | 4/2021 | Harikrishna Mohan | H01L 51/5221 |

FOREIGN PATENT DOCUMENTS

| | | |
|---|---|---|
| CN | 106981584 A | 7/2017 |
| CN | 107221550 A | 9/2017 |
| CN | 107910296 A | 4/2018 |
| JP | 2015215882 A | 12/2015 |
| KR | 20140099139 A | 8/2014 |
| KR | 20160013460 A | 2/2016 |
| KR | 20180029956 A | 3/2018 |
| KR | 20180086410 A | 7/2018 |
| TW | 201640708 A | 11/2016 |

OTHER PUBLICATIONS

First Office Action in the Korean Patent Application No. 20197018877 dated Apr. 29, 2020; English translation attached.
International Search Report & Written Opinion dated Apr. 28, 2019, regarding PCT/CN2018/109622.

* cited by examiner

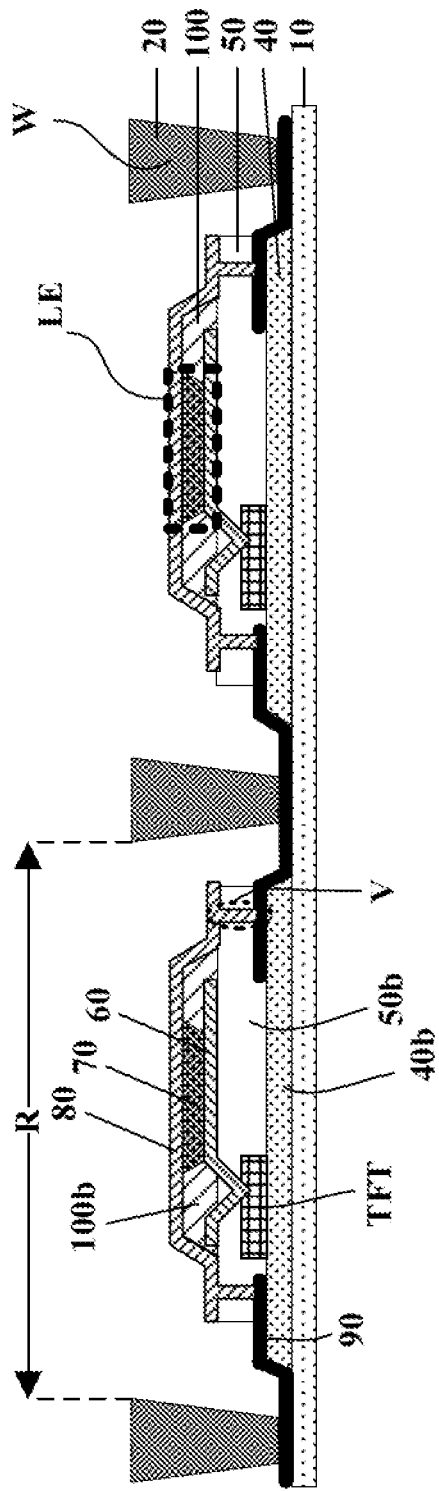
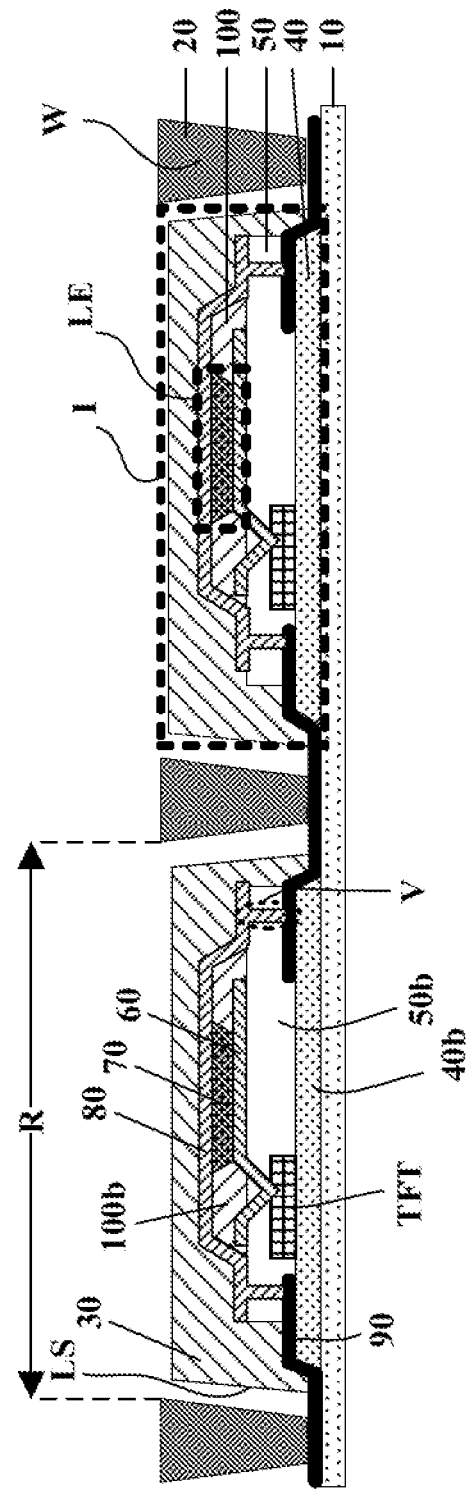
FIG. 12C
FIG. 12D

DISPLAY SUBSTRATE, DISPLAY APPARATUS, METHOD OF FABRICATING DISPLAY SUBSTRATE

CROSS-REFERENCE TO RELATED APPLICATION

This application is a national stage application under 35 U.S.C. § 371 of International Application No. PCT/CN2018/109622, filed Oct. 10, 2018, the contents of which are incorporated by reference in the entirety.

TECHNICAL FIELD

The present invention relates to display technology, more particularly, to a display substrate, a display apparatus, and a method of fabricating a display substrate.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allows its length to be increased in one or more dimensions. Stretchable electronic apparatuses may be useful in various applications including in display apparatuses and sensor arrays.

SUMMARY

In one aspect, the present invention provides a display substrate, comprising a base substrate; a crack barrier layer on the base substrate defining a plurality of crack barrier regions in the display substrate; and a plurality of encapsulated islands on the base substrate and respectively in the plurality of crack barrier regions; wherein each of the plurality of encapsulated islands comprises at least one of a plurality of light emitting elements; and an encapsulating layer encapsulating the at least one of a plurality of light emitting elements and forming a lateral side of a respective one of the plurality of encapsulated islands; wherein the crack barrier layer forms a barrier wall for preventing cracks in one or more sublayers of the display substrate outside the plurality of encapsulated islands from propagating into inside of each of the plurality of encapsulated islands.

Optionally, the barrier wall has a first side facing the base substrate, a second side substantially opposite to the first side and facing away the base substrate, a third side and a fourth side respectively connecting the first side and the second side; the third side has a first average slope angle with respect to the first side greater than approximately 90 degrees; and the fourth side has a second average slope angle with respect to the first side greater than approximately 90 degrees.

Optionally, the first average slope angle is in a range of approximately 120 degrees to approximately 160 degrees; and the second average slope angle is in a range of approximately 120 degrees to approximately 160 degrees.

Optionally, the barrier wall has a height between the first side and the second side in a range of approximately 2 µm to approximately 6 µm.

Optionally, the barrier wall is spaced apart from the lateral side of the respective one of the plurality of encapsulated islands by a gap.

Optionally, the display substrate further comprises a barrier layer on the base substrate and comprising a plurality of barrier blocks spaced apart from each other; wherein each of the plurality of encapsulated islands further comprises one of the plurality of barrier blocks on a side of the at least one of the plurality of light emitting elements distal to the encapsulating layer.

Optionally, the encapsulating layer is in direct contact with each of the plurality of barrier blocks to encapsulate the plurality of light emitting elements.

Optionally, the display substrate further comprises a planarization layer on the base substrate and comprising a plurality of planarization blocks spaced apart from each other; wherein each of the plurality of encapsulated islands further comprises at least one thin film transistor on a respective one of the plurality of barrier blocks; and a respective one of the plurality of planarization blocks on a side of the at least one thin film transistor distal to the respective one of the plurality of barrier blocks; wherein the at least one of the plurality of light emitting elements is on a side of the respective one of the plurality of planarization blocks distal to the base substrate.

Optionally, each of the at least one of the plurality of light emitting elements comprises a first electrode, a light emitting layer on the first electrode, and a second electrode on a side of the light emitting layer distal to the first electrode; the display substrate further comprises a plurality of signal lines passing through underneath the barrier wall thereby connecting electronic components in adjacent encapsulated islands of the plurality of encapsulated islands; and the second electrode is electrically connected to one of the plurality of signal lines through a via extending through the respective one of the plurality of planarization blocks.

Optionally, the display substrate further comprises a pixel definition layer on a side of the planarization layer distal to the base substrate, and comprising a plurality of pixel definition blocks spaced apart from each other, each of the plurality of pixel definition blocks defining a pixel aperture; wherein each of the plurality of encapsulated islands further comprises a respective one of the plurality of pixel definition blocks on a side of the respective one of the plurality of planarization blocks distal to the base substrate.

Optionally, the crack barrier layer comprises a plurality of barrier enclosures spaced apart from each other; each individual one of the plurality of barrier enclosures defines a respective one of the plurality of crack barrier regions; and barrier walls of adjacent barrier enclosures of the plurality of barrier enclosures are spaced apart from each other by a gap.

Optionally, the display substrate comprises three or more barrier walls of the crack barrier layer between adjacent encapsulated islands of the plurality of encapsulated islands, the three or more barrier walls spaced apart from each other by a gap.

Optionally, a total number of the plurality of light emitting elements in each individual one of plurality of encapsulated islands is one.

Optionally, the encapsulating layer comprises at least one inorganic encapsulating sublayer; and the crack barrier layer is configured to prevent cracks in the at least one inorganic encapsulating sublayer outside the plurality of encapsulated islands from propagating into inside of each of the plurality of encapsulated islands.

Optionally, the base substrate is a stretchable base substrate; the display substrate is a stretchable display substrate having a substantially non-stretched state and a stretched state; and the cracks in the one or more sublayers of the display substrate outside the plurality of crack barrier regions are cracks resulting from the display substrate transitioning between the substantially non-stretched state and the stretched state.

Optionally, the barrier wall is in direct contact with the base substrate.

In another aspect, the present invention provides a display apparatus comprising the display substrate described herein or fabricated by a method described herein.

In another aspect, the present invention provides a method of fabricating a display substrate, comprising forming a crack barrier layer on a base substrate defining a plurality of crack barrier regions in the display substrate; and forming a plurality of encapsulated islands on the base substrate and respectively in the plurality of crack barrier regions; wherein forming each of the plurality of encapsulated islands comprises forming at least one of a plurality of light emitting elements; and forming an encapsulating layer encapsulating the at least one of a plurality of light emitting elements, the encapsulating layer forming a lateral side of a respective one of the plurality of encapsulated islands; wherein the crack barrier layer is formed to constitute a barrier wall for preventing cracks in one or more sublayers of the display substrate outside the plurality of encapsulated islands from propagating into inside of each of the plurality of encapsulated islands.

Optionally, the encapsulating layer is formed by depositing an encapsulating material subsequent to forming the crack barrier layer.

Optionally, the crack barrier layer is formed to have an undercut profile; and the barrier wall is formed to have a first side facing the base substrate, a second side substantially opposite to the first side and facing away the base substrate, a third side and a fourth side respectively connecting the first side and the second side; the third side has a first average slope angle with respect to the first side greater than approximately 90 degrees; and the fourth side has a second average slope angle with respect to the first side greater than approximately 90 degrees.

BRIEF DESCRIPTION OF THE FIGURES

The following drawings are merely examples for illustrative purposes according to various disclosed embodiments and are not intended to limit the scope of the present invention.

FIG. 12A to 12D illustrate a method of fabricating a display substrate in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate, a display apparatus, and a method of fabricating a display substrate that substantially obviate one or more of the problems due to limitations and disadvantages of the related art. In one aspect, the present disclosure provides a display substrate. In some embodiments, the display substrate includes a base substrate; a crack barrier layer on the base substrate defining a plurality of crack barrier regions in the display substrate; and a plurality of encapsulated islands on the base substrate and respectively in the plurality of crack barrier regions. Optionally, each of the plurality of encapsulated islands includes at least one of a plurality of light emitting elements; and an encapsulating layer encapsulating the at least one of a plurality of light emitting elements and forming a lateral side of a respective one of the plurality of encapsulated islands. Optionally, the crack barrier layer forms a barrier wall for preventing cracks in one or more sublayers of the display substrate outside the plurality of encapsulated islands from propagating into inside of each of the plurality of encapsulated islands.

Figure 1:
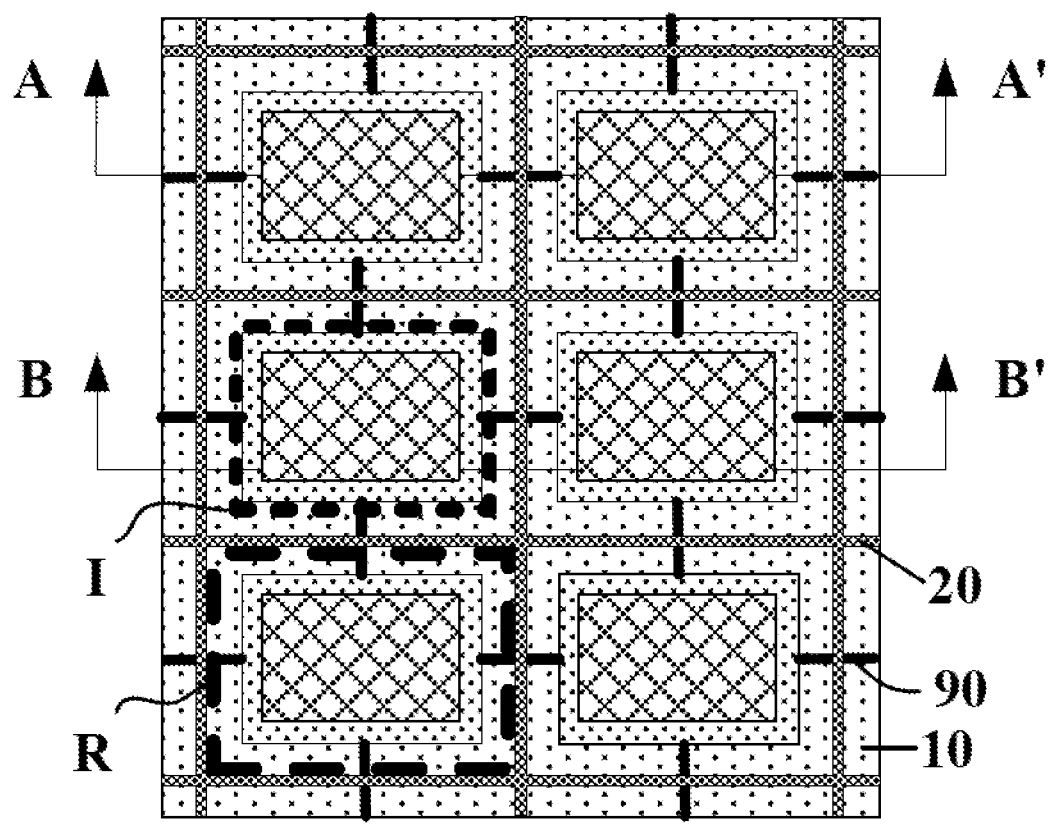
FIG. 1 is a schematic diagram illustrating the structure of a display substrate in some embodiments according to the present disclosure.
Figure 2:
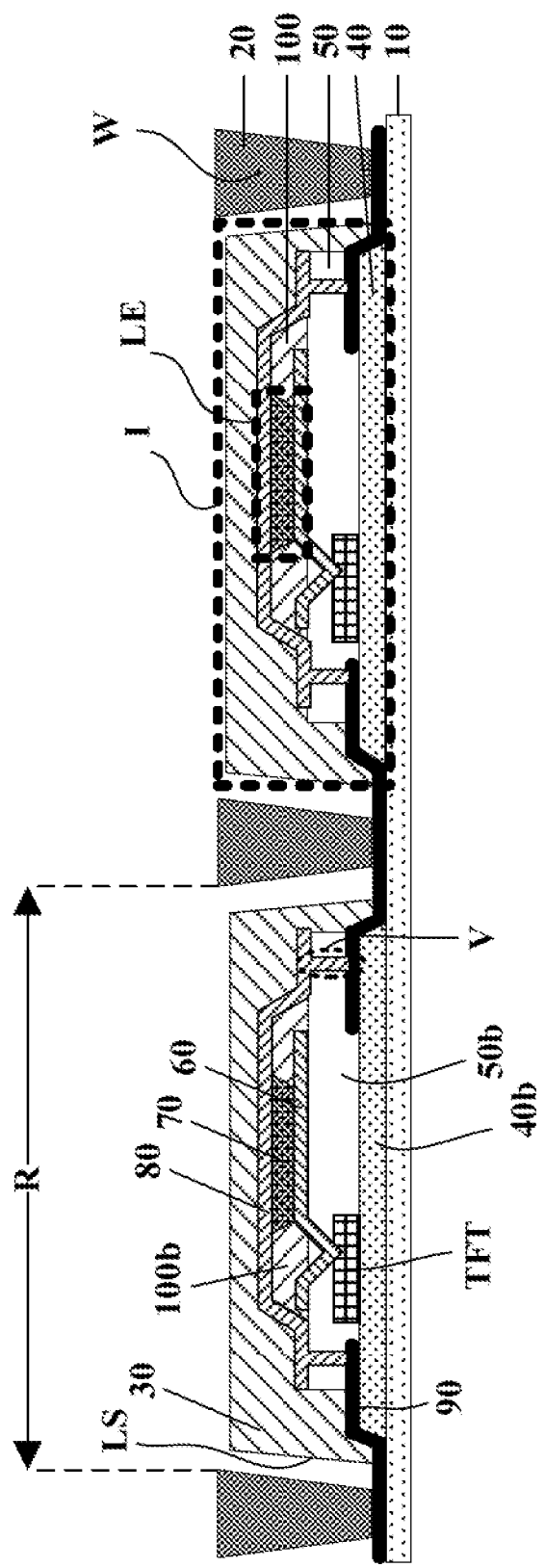
FIG. 2 is a cross-sectional view along the A-A' line of FIG. 1.
Figure 3:
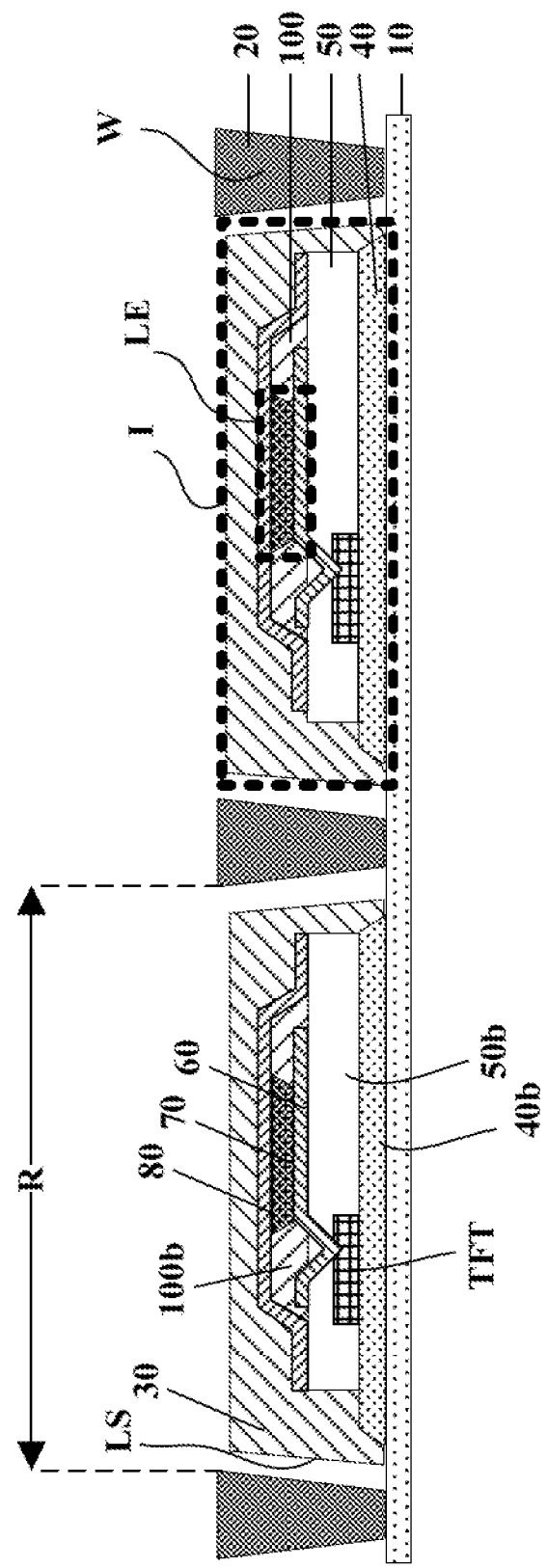
FIG. 3 is a cross-sectional view along the B-B' line of FIG. 1.

FIG. 1 is a schematic diagram illustrating the structure of a display substrate in some embodiments according to the present disclosure. FIG. 2 is a cross-sectional view along the A-A' line of FIG. 1. FIG. 3 is a cross-sectional view along the B-B' line of FIG. 1. Referring to FIGS. 1-3, the display substrate in some embodiments includes a base substrate 10; a crack barrier layer 20 on the base substrate 10 defining a plurality of crack barrier regions R in the display substrate; and a plurality of encapsulated islands I on the base substrate 10 and respectively in the plurality of crack barrier regions R. As shown in FIG. 2, each of the plurality of encapsulated islands I in some embodiments includes at least one of a plurality of light emitting elements LE, and an encapsulating layer 30 encapsulating the at least one of the plurality of light emitting elements LE and forming a lateral side LS of a respective one of the plurality of encapsulated islands I. The crack barrier layer 20 forms a barrier wall W for preventing cracks in one or more sublayers of the display substrate outside the plurality of encapsulated islands I from propagating into inside of each of the plurality of encapsulated islands I.

Figure 4:
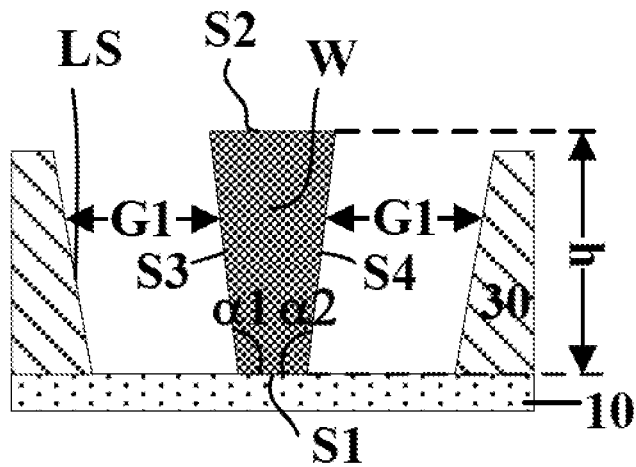
FIG. 4 is a schematic diagram illustrating the structure of a barrier wall in some embodiments according to the present disclosure.

FIG. 4 is a schematic diagram illustrating the structure of a barrier wall in some embodiments according to the present disclosure. Referring to FIG. 4, the barrier wall W in some embodiments has a first side S1 facing the base substrate 10, a second side S2 substantially opposite to the first side S1 and facing away the base substrate 10, a third side S3 and a fourth side S4 respectively connecting the first side S1 and the second side S2. The barrier wall W is formed to have an undercut profile. Specifically, in some embodiments, the third side S3 has a first average slope angle $\alpha 1$ with respect to the first side S1, the first average slope angle $\alpha 1$ is greater than approximately 90 degrees, e.g., greater than approximately 100 degrees, greater than approximately 110 degrees, greater than approximately 120 degrees, greater than approximately 130 degrees, greater than approximately 140 degrees, greater than approximately 150 degrees, and greater than approximately 160 degrees. The fourth side S4 has a second average slope angle $\alpha 2$ with respect to the first side S1, the second average slope angle $\alpha 2$ is greater than approximately 90 degrees, e.g., greater than approximately 100 degrees, greater than approximately 110 degrees, greater than approximately 120 degrees, greater than approximately 130 degrees, greater than approximately 140 degrees, greater than approximately 150 degrees, and greater than approximately 160 degrees. Optionally, the first average slope angle $\alpha 1$ is in a range of approximately 120 degrees to approximately 160 degrees. Optionally, the second average slope angle $\alpha 2$ is in a range of approximately 120 degrees to approximately 160 degrees.

The barrier wall W has a height h between the first side S1 and the second side S2. Optionally, the height h is in a range of approximately 1 µm to approximately 40 µm, e.g., approximately 1 µm to approximately 30 µm, approximately 2 µm to approximately 20 µm, approximately 5 µm to approximately 15 µm, approximately 2 µm to approximately 10 µm. Optionally, the height h is in a range of approximately 2 µm to approximately 6 µm.

Referring to FIGS. 1 to 4, the barrier wall W in some embodiments is spaced apart from the lateral side LS of the respective one of the plurality of encapsulated islands I by a first gap G1. The fast gap G1 between the barrier wall W and the lateral side LS of the respective one of the plurality of encapsulated islands I may have any appropriate gap distance. Optionally, the first gap G1 has a distance in a range of approximately 10 µm to approximately 200 µm, e.g., approximately 10 µm to approximately 150 µm, approximately 10 µm to approximately 100 µm, and approximately 10 µm to approximately 50 µm.

Referring to FIG. 2 and FIG. 3, the display substrate in some embodiments further includes a barrier layer 40 on the base substrate 10. The barrier layer 40 includes a plurality of barrier blocks 40b spaced apart from each other. Optionally, each of the plurality of encapsulated islands I includes one of the plurality of barrier blocks 40b on a side of the at least one of the plurality of light emitting elements LE distal to the encapsulating layer 30. Optionally, each of the plurality of encapsulated islands I includes multiple ones of the plurality of barrier blocks 40b respectively on a side of multiple ones of the plurality of light emitting elements LE distal to the encapsulating layer 30.

In some embodiments, the encapsulating layer 30 and the barrier layer 40 cooperatively encapsulate the plurality of light emitting elements LE. For example, the encapsulating layer 30 is in direct contact with the barrier layer 40 to encapsulate the plurality of light emitting elements LE. Optionally, the encapsulating layer 30 is in direct contact with each of the plurality of barrier blocks 40b to encapsulate the at least one of the plurality of light emitting elements LE on a respective one of the plurality of barrier blocks 40b. In one example, the encapsulating layer 30 is in direct contact with an entire periphery of the respective one of the plurality of barrier blocks 40b, thereby encapsulate the at least one of the plurality of light emitting elements LE inside the space between the encapsulating layer 30 and the respective one of the plurality of barrier blocks 40b.

Referring to FIG. 2 and FIG. 3, the display substrate in some embodiments further includes a planarization layer 50 on the base substrate 10. The planarization layer 50 includes a plurality of planarization blocks 50b spaced apart from each other. Optionally, each of the plurality of encapsulated islands I includes at least one thin film transistor TFT on a respective one of the plurality of barrier blocks 40b, and a respective one of the plurality of planarization blocks 50b on a side of the at least one thin film transistor TFT distal to the respective one of the plurality of barrier blocks 40b. Optionally, the at least one of the plurality of light emitting elements LE in a respective one of the plurality of encapsulated islands I is on a side of the respective one of the plurality of planarization blocks 50b distal to the base substrate 10.

Referring to FIG. 2 and FIG. 3, in some embodiments, each of the at least one of the plurality of light emitting elements LE includes a first electrode 60 (e.g., an anode), a light emitting layer 70 on the first electrode 60, and a second electrode 80 on a side of the light emitting layer 70 distal to the first electrode 60. Optionally, the at least one of the plurality of light emitting elements LE is an organic light emitting diode, and the light emitting layer 70 is an organic light emitting layer.

Referring to FIG. 1 and FIG. 2, in some embodiments, the display substrate further includes a plurality of signal lines 90. Examples of the plurality of signal lines 90 include gate lines, data lines, common voltage signals lines, touch signal lines, and so on. Electronic components (e.g., the at least one thin film transistors TFT and the plurality of light emitting elements LE) of the display substrate encapsulated inside the plurality of encapsulated islands I may be connected to each other through the plurality of signal lines 90. For example, a gate line may be connected to a row of thin film transistors in the display substrate, and a data line may be connected to a column of thin film transistors in the display substrate. Optionally, and referring to FIG. 2, the plurality of signal lines 90 pass through underneath the barrier wall W thereby connecting electronic components in adjacent encapsulated islands of the plurality of encapsulated islands I. Optionally, the second electrode 80 is electrically connected to one of the plurality of signal lines 90 through a via V extending through the respective one of the plurality of planarization blocks 50b.

Referring to FIG. 2 and FIG. 3, the display substrate in some embodiments further includes a pixel definition layer 100 on a side of the planarization layer 50 distal to the base substrate 10. The pixel definition layer 100 includes a plurality of pixel definition blocks 100b spaced apart from each other. Each of the plurality of pixel definition blocks defines a pixel aperture. Optionally, each of the plurality of encapsulated islands I includes a respective one of the plurality of pixel definition blocks 100b on a side of the respective one of the plurality of planarization blocks 50b distal to the base substrate 10. The encapsulating layer 30 is on a side of the plurality of pixel definition blocks 100b distal to the base substrate 10.

In some embodiments, the base substrate 10 is a stretchable base substrate, and the display substrate is a stretchable display substrate having a substantially non-stretched state and a stretched state. The plurality of encapsulated islands I are relatively rigid regions of the display substrate. When the display substrate is subject to a stretching action, the plurality of encapsulated islands I remain substantially undeformed or only slightly deformed. The regions of the display substrate between the plurality of encapsulated islands I (e.g., the regions between lateral sides of adjacent encapsulated islands of the plurality of encapsulated islands I) are relatively elastic regions. When the display substrate is subject to a stretching action, the regions of the display substrate between the plurality of encapsulated islands I undergo reversible deformation. By having the plurality of encapsulated islands I relatively rigid, damages to the plurality of encapsulated islands I during the stretching action may be avoided, and the electronic components inside the plurality of encapsulated islands I remain tightly encapsulated. Optionally, the cracks in the one or more sublayers of the display substrate outside the plurality of crack barrier regions R are cracks resulting from the display substrate transitioning between the substantially non-stretched state and the stretched state. By having the crack barrier layer 20, the cracks resulting from the display substrate transitioning between the substantially non-stretched state and the stretched state are prevented from propagating into inside of each of the plurality of encapsulated islands I.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

The rigid regions of the display substrate have a Young's modulus greater than that of the elastic regions of the display substrate. Optionally, a ratio of the Young's modulus of the rigid regions to the Young's modulus of the elastic regions is greater than 2, e.g., greater than 3, greater than 4, greater than 5, greater than 7.5, greater than 10, greater than 20, greater than 30, greater than 40, greater than 50, greater than 60, greater than 70, greater than 80, greater than 90, and greater than 100. Optionally, the elastic regions have a Young's modulus in a range of approximately 0.001 GPa to approximately 1.5 GPa, e.g., approximately 0.001 GPa to approximately 0.1 GPa, approximately 0.1 GPa to approximately 0.2 GPa, approximately 0.2 GPa to approximately 0.3 GPa, approximately 0.3 GPa to approximately 0.4 GPa, and approximately 0.4 GPa to approximately 0.5 GPa, approximately 0.5 GPa to approximately 1.0 GPa and approximately 1.0 GPa to approximately 1.5 GPa. Optionally, the rigid regions have a Young's modulus greater than 2.0 GPa, e.g., approximately 2.0 GPa to approximately 10 GPa, approximately 10 GPa to approximately 20 GPa, approximately 20 GPa to approximately 40 GPa, greater than 40 GPa, greater than 100 GPa, greater than 200 GPa. and greater than 400 GPa.

Figure 5:
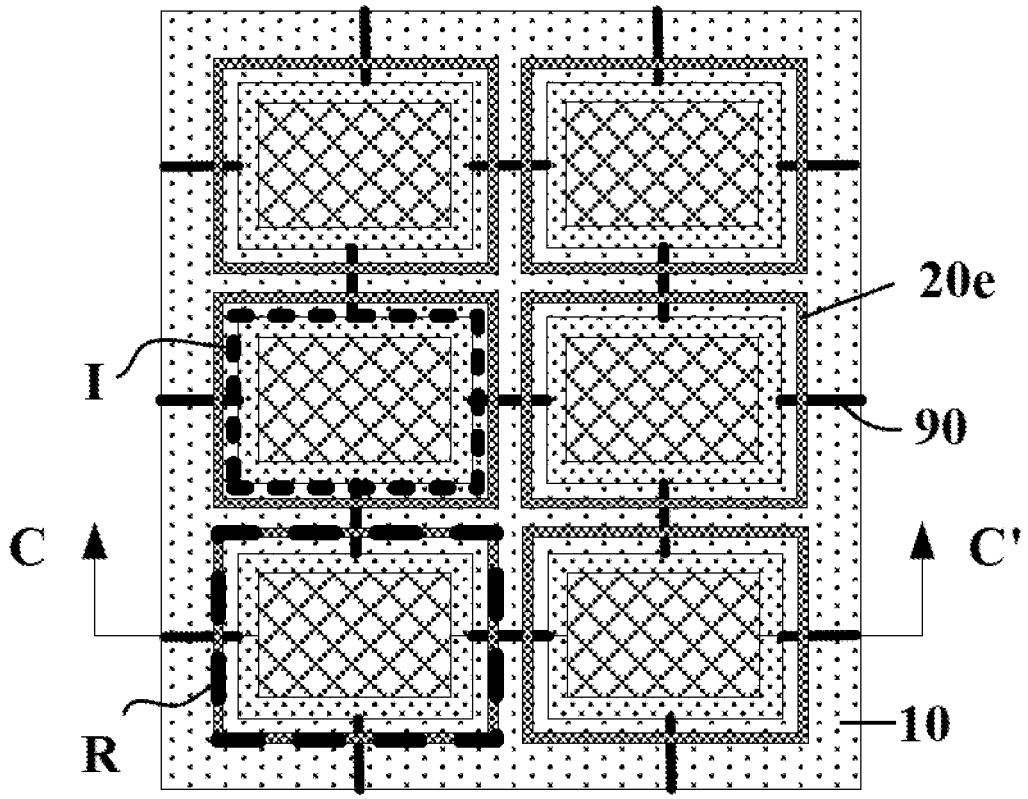
FIG. 5 is a schematic diagram illustrating the structure of a display substrate in some embodiments according to the present disclosure.
Figure 6:
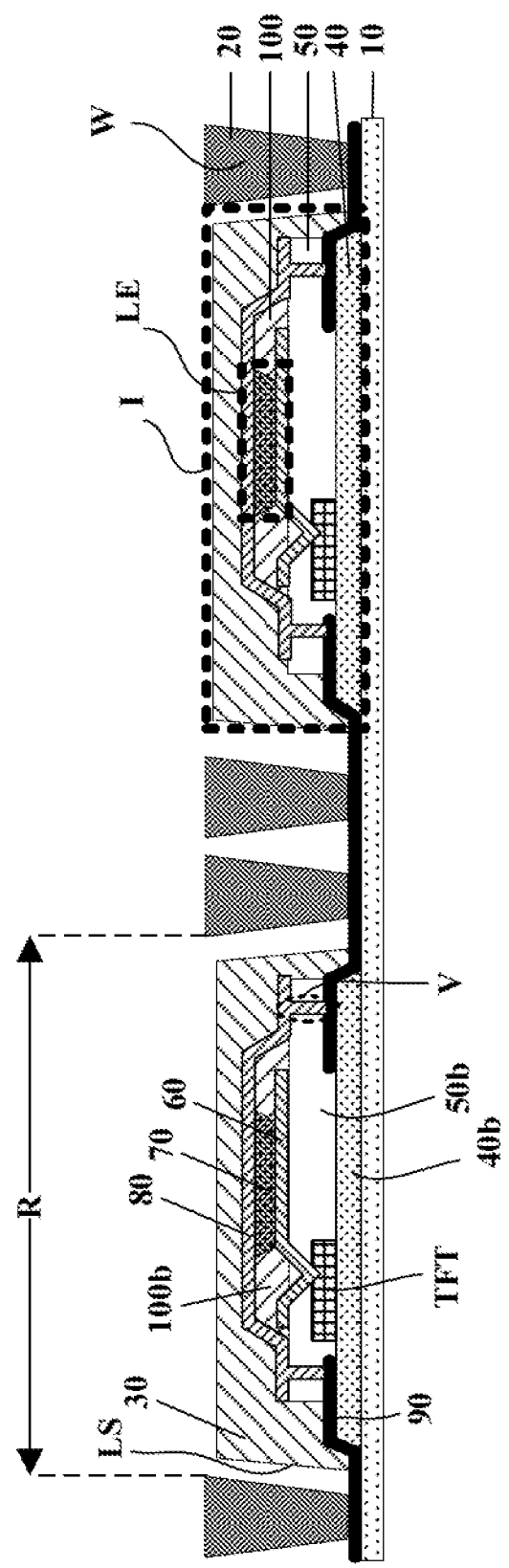
FIG. 6 is a cross-sectional view along the C-C' line of FIG. 5.

FIG. 5 is a schematic diagram illustrating the structure of a display substrate in some embodiments according to the present disclosure. FIG. 6 is a cross-sectional view along the C-C' line of FIG. 5. Referring to FIG. 5, the crack barrier layer 20 in some embodiments includes a plurality of barrier enclosures 20e spaced apart from each other. Optionally, the plurality of barrier enclosures 20e are disconnected from each other, as shown in FIG. 5. Optionally, the plurality of barrier enclosures 20e are spaced apart but connected to each other, e.g., by one or more bridges. Referring to FIG. 5 and FIG. 6, each individual one of the plurality of barrier enclosures 20e defines a respective one of the plurality of crack barrier regions R.

Figure 7:
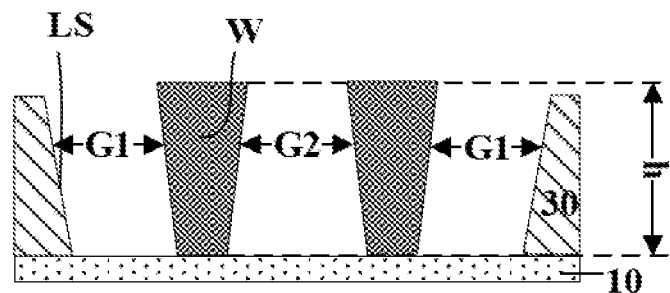
FIG. 7 is a schematic diagram illustrating the structure of a barrier wall in some embodiments according to the present disclosure.

FIG. 7 is a schematic diagram illustrating the structure of a barrier wall in some embodiments according to the present disclosure. Referring to FIG. 7, barrier walls W of adjacent barrier enclosures of the plurality of barrier enclosures 20e are spaced apart by a second gap G2. The second gap G2 between adjacent barrier enclosures of the plurality of barrier enclosures 20e may have any appropriate gap distance. Optionally, the second gap G2 has a distance in a range of approximately 10 μm to approximately 200 μm, e.g., approximately 10 μm to approximately 150 μm, approximately 10 μm to approximately 100 μm, and approximately 10 μm to approximately 50 μm.

In some embodiments, the base substrate 10 is a stretchable base substrate, and the display substrate is a stretchable display substrate having a substantially non-stretched state and a stretched state. The plurality of encapsulated islands I are relatively rigid regions of the display substrate, and the regions of the display substrate between the plurality of encapsulated islands I are relatively elastic regions. By having the plurality of barrier enclosures 20e spaced apart from each other, the rigid regions and the elastic regions are further defined.

Each of the plurality of encapsulated islands I may contain various appropriate numbers of light emitting elements. As shown in FIG. 2. FIG. 3, and FIG. 6, in some embodiments, each of the plurality of encapsulated islands I contain a single one of the plurality of light emitting elements LE, i.e., a total number of the plurality of light emitting elements LE in each individual one of plurality of encapsulated islands is one. Accordingly, in some embodiments, each of the plurality of encapsulated islands I corresponds to a single subpixel.

Figure 8:
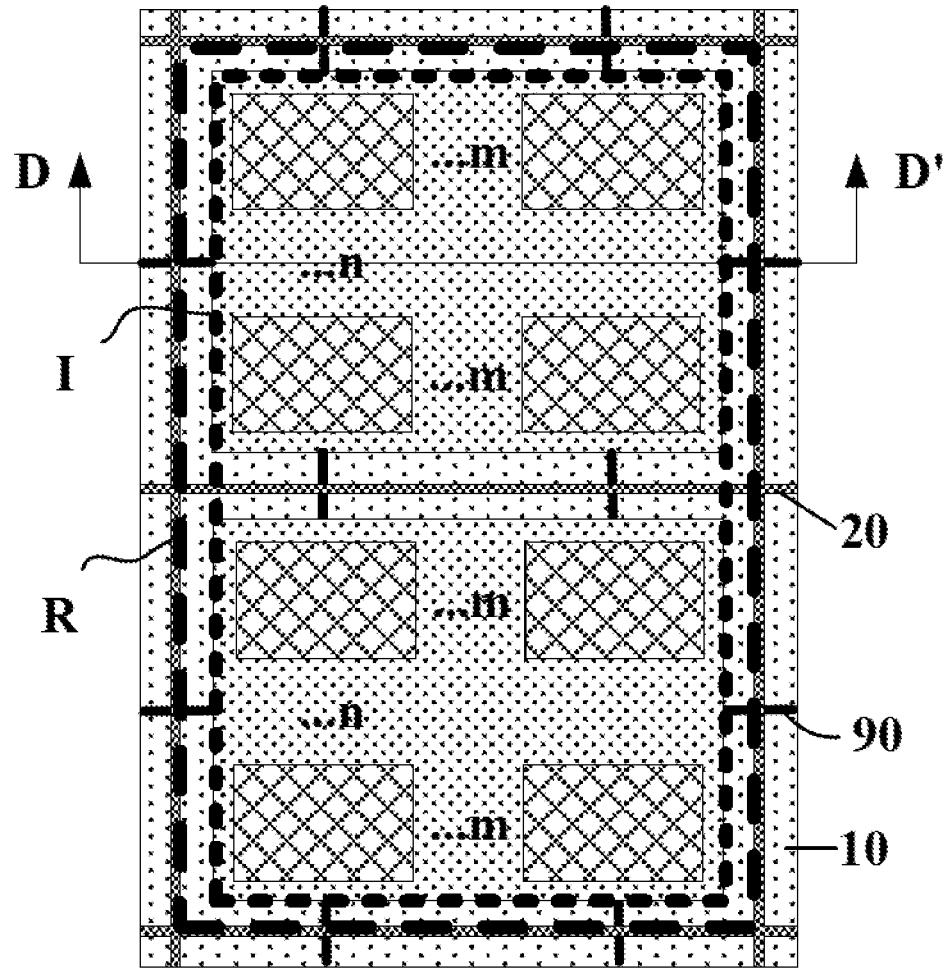
FIG. 8 is a schematic diagram illustrating the structure of a display substrate in some embodiments according to the present disclosure.
Figure 9:
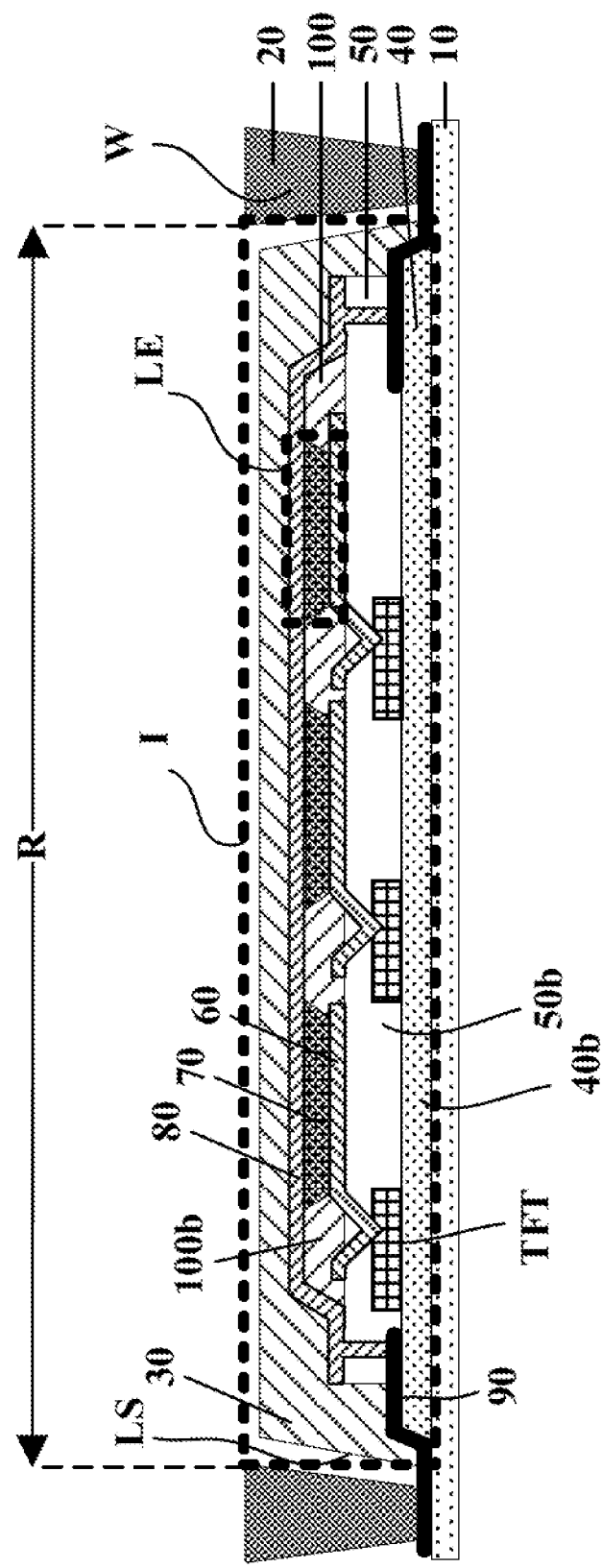
FIG. 9 is a cross-sectional view along the D-D' line of FIG. 8.

In some embodiments, each of the plurality of encapsulated islands I contains multiple ones of the plurality of light emitting elements LE. i.e., a total number of the plurality of light emitting elements LE in each individual one of plurality of encapsulated islands is greater than one. Optionally, a total number of the plurality of light emitting elements LE in each individual one of plurality of encapsulated islands is three, and each of the plurality of encapsulated islands I corresponds to a pixel having three subpixels (e.g., a red subpixel, a green subpixel, and a blue subpixel). FIG. 8 is a schematic diagram illustrating the structure of a display substrate in some embodiments according to the present disclosure. Referring to FIG. 8, in some embodiments, each of the plurality of encapsulated islands I contains m×n ones of the plurality of light emitting elements LE. i.e., a total number of the plurality of light emitting elements LE in each individual one of plurality of encapsulated islands is m×n. FIG. 9 is a cross-sectional view along the D-D' line of FIG. 8. FIG. 9 illustrates an example where each of the plurality of encapsulated islands I contains three light emitting elements of the plurality of light emitting elements LE, e.g., a red light emitting element, a green light emitting element, and a blue light emitting element.

Figure 10:
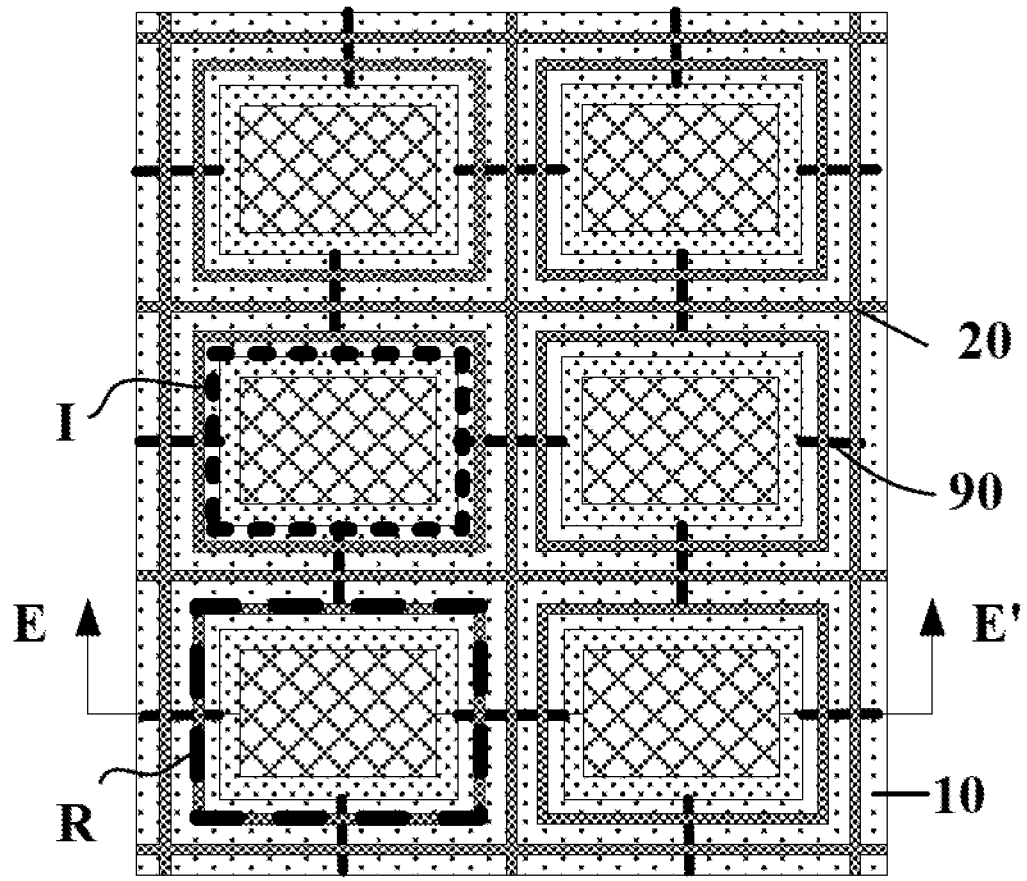
FIG. 10 is a schematic diagram illustrating the structure of a display substrate in some embodiments according to the present disclosure.
Figure 11:
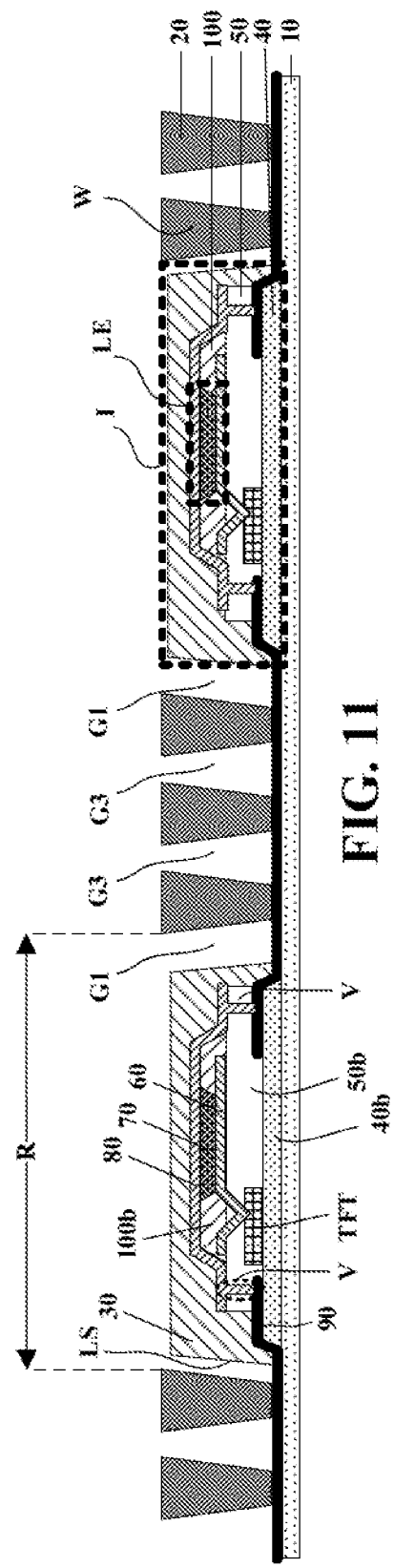
FIG. 11 is a cross-sectional view along the E-E' line of FIG. 10.

In some embodiments, the display substrate includes three or more barrier walls of the crack barrier layer 20 between adjacent encapsulated islands of the plurality of encapsulated islands I, the three or more barrier walls spaced apart from each other by a gap. FIG. 10 is a schematic diagram illustrating the structure of a display substrate in some embodiments according to the present disclosure. FIG. 11 is a cross-sectional view along the E-E' line of FIG. 10. Referring to FIG. 10 and FIG. 11, the display substrate includes three barrier walls of the crack barmier layer 20 between adjacent encapsulated islands of the plurality of encapsulated islands I. The barrier wall W is spaced apart from the lateral side LS of the respective one of the plurality of encapsulated islands I by a first gap G1. Barrier walls W in a region between two adjacent encapsulated islands of the plurality of encapsulated islands I are spaced apart from each other by a third gap G3. Optionally, the first gap G1 has a distance in a range of approximately 10 μm to approximately 200 μm. e.g., approximately 10 μm to approximately 150 μm, approximately 10 μm to approximately 100 μm, and approximately 10 μm to approximately 50 sm. Optionally, the third gap G3 has a distance in a range of approximately 10 μm to approximately 200 μm, e.g., approximately 10 μm to approximately 150 μm, approximately 10 μm to approximately 100 μm, and approximately 10 μm to approximately 50 μm.

In some embodiments, the encapsulating layer 30 includes at least one inorganic encapsulating sublayer. Optionally, the encapsulating layer 30 includes one or more inorganic encapsulating sublayers and one or more organic encapsulating sublayers. The crack barrier layer 20 is configured to prevent cracks in the at least one inorganic encapsulating sublayer outside the plurality of encapsulated islands I from propagating into inside of each of the plurality of encapsulated islands I.

Various appropriate light emitting elements may be used in the present display substrate. Examples of appropriate light emitting elements include an organic light emitting diode, a quantum dots light emitting diode, and a micro light emitting diode.

In another aspect, the present disclosure provides a method of fabricating a display substrate having a plurality of subpixel areas. In some embodiments, the method includes forming a crack barrier layer on a base substrate defining a plurality of crack barrier regions in the display substrate; and forming a plurality of encapsulated islands on the base substrate and respectively in the plurality of crack barrier regions. Optionally, the step of forming each of the plurality of encapsulated islands includes forming at least one of a plurality of light emitting elements; and forming an encapsulating layer encapsulating the at least one of a plurality of light emitting elements, the encapsulating layer forming a lateral side of a respective one of the plurality of encapsulated islands. Optionally, the crack barrier layer is formed to constitute a barrier wall for preventing cracks in one or more sublayers of the display substrate outside the plurality of encapsulated islands from propagating into inside of each of the plurality of encapsulated islands.

Figure 12A:
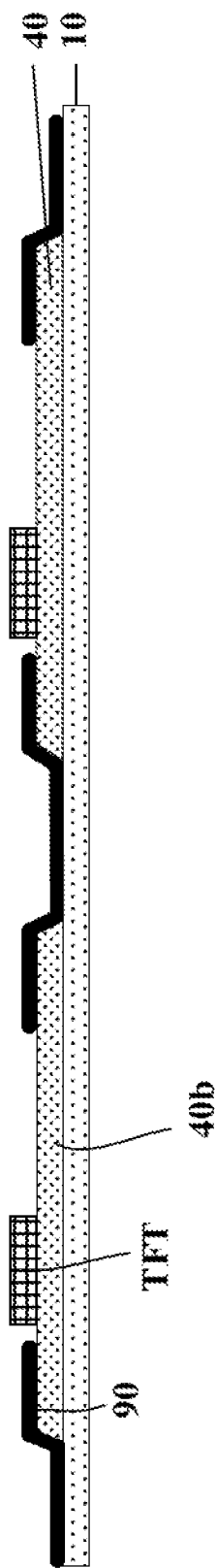

FIG. 12A to 12D illustrate a method of fabricating a display substrate in some embodiments according to the present disclosure. Referring to FIG. 12A, a barrier layer 40 is formed on a base substrate 10, and is formed to include a plurality of barrier blocks 40b spaced apart from each other.

At least one thin film transistor TFT is formed on a respective one of the plurality of barrier blocks 40b. A plurality of signal lines 90 are formed to extend from a region having the respective one of the plurality of barrier blocks 40b to outside the region. The plurality of signal lines 90 includes, for example, a gate line and a data line connected to the at least one thin film transistor TFT. Various appropriate conductive materials may be used for making the plurality of signal lines 90. Examples of appropriate conductive materials for making the plurality of signal lines 90 include metals, alloys, graphene, carbon nanotubes, flexible conductive polymers, and other flexible conductive materials. Optionally, the plurality of signal lines 90 are flexible signal lines or metallic signal lines having a relatively high elasticity. The plurality of signal lines 90 may be made to have various appropriate patterns. Examples of appropriate patterns of the plurality of signal lines 90 include straight lines, curve lines, and any combination thereof. Optionally, each of the plurality of signal lines 90 has a zig-zag pattern at least outside the region having the plurality of barrier blocks 40b. Optionally, the zig-zag pattern may be one with round corners, or one with sharp corners.

Various appropriate flexible materials may be used for making the base substrate 10. Examples of appropriate flexible materials for making the base substrate 10 include polyimide, polycarbonate, polyethersulfone, polyethylene terephthalate, polyethylene naphthalate, polyarylate, and fiber-reinforced plastic. Optionally, the base substrate 10 is a transparent base substrate. Optionally, the base substrate 10 is a non-transparent base substrate.

Various appropriate insulating materials and various appropriate fabricating methods may be used to make the barrier layer 40. For example, an insulating material may be deposited on the substrate by a plasma-enhanced chemical vapor deposition (PECVD) process and patterned. Examples of appropriate insulating materials for making the barrier layer 40 include, but are not limited to, silicon oxide ($SiO_x$), silicon nitride ($SiN_y$, e.g., $Si_3N_4$), silicon oxynitride ($SiO_xN_y$). Optionally, the barrier layer 40 is made of an inorganic material.

Figure 12B:
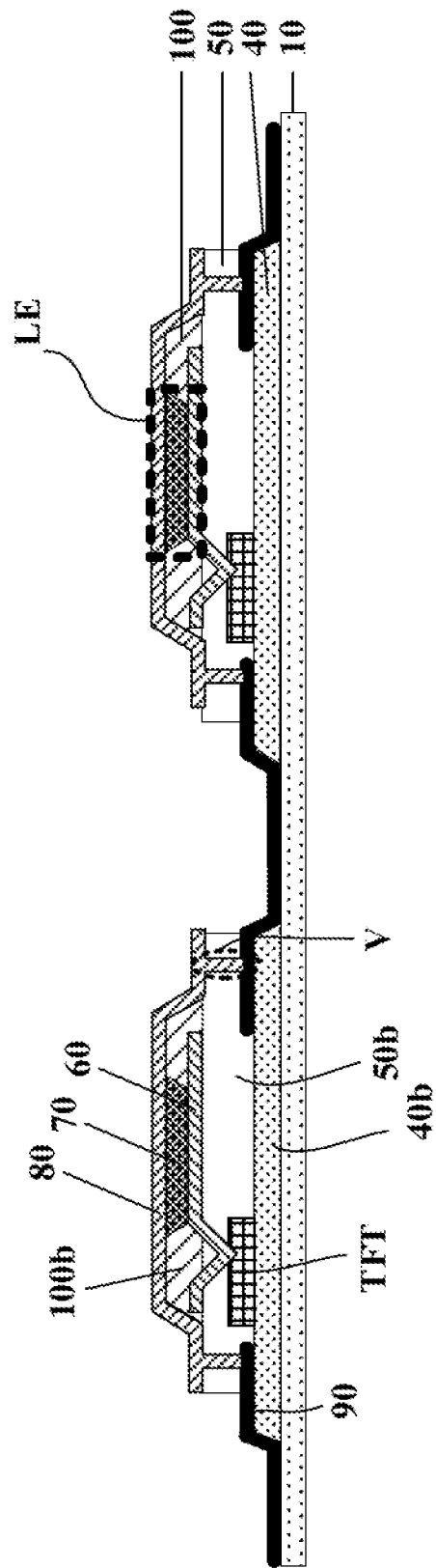

Referring to FIG. 12B, a planarization layer 50 is then formed on a side of the barrier layer 40 distal to the base substrate 10. The planarization layer 50 is formed to include a plurality of planarization blocks 50b spaced apart from each other. Optionally, each of the plurality of planarization blocks 50b is formed on a side of the at least one thin film transistor TFT distal to a respective one of the plurality of barrier blocks 40b. Subsequently, a first electrode 60 is formed on the planarization layer 50, e.g., on a respective one of the plurality of planarization blocks 50b. A pixel definition layer 100 is formed on the planarization layer 50, the pixel definition layer 100 is formed to include a plurality of pixel definition blocks 100b spaced apart from each other, each of the plurality of pixel definition blocks 100b defining a pixel aperture. Inside the pixel aperture, a light emitting layer 70 is formed. The method further includes forming a via V extending through the planarization layer 50. A second electrode 80 is formed on a side of the light emitting layer 70 distal to the base substrate, thereby forming the plurality of light emitting elements LE. The second electrode 80 is formed to connect to a respective one of the plurality of signal lines 90 through the via V. The first electrode 60 is formed to be electrically connected to a source electrode of one of the at least one thin film transistor TFT.

Various appropriate insulating materials and various appropriate fabricating methods may be used to make the planarization layer 50 and the pixel definition layer 100. For example, an insulating material may be deposited on the substrate by a plasma-enhanced chemical vapor deposition (PECVD) process and patterned. Examples of appropriate insulating materials for making the planarization layer 50 and the pixel definition layer 100 include, but are not limited to, silicon oxide ($SiO_x$), silicon nitride ($SiN_y$, e.g., $Si_3N_4$), silicon oxynitride ($SiO_xN_y$), various resins, and various organic polymers.

Referring to FIG. 12C, prior to forming the encapsulating layer, a crack barrier layer 20 is formed on the base substrate 10 to define a plurality of crack barrier regions R. Various appropriate materials may be used for making the crack barrier layer 20. Optionally, the crack barrier layer 20 is made of a material having a relatively small Young's modulus. In some embodiments, the crack barrier layer 20 is made of a material having a Young's modules in a range of approximately 2.0 to approximately 20 GPa, e.g., approximately 2.0 to approximately 4.0 GPa, approximately 4.0 to approximately 6.0 GPa, approximately 6.0 to approximately 8.0 GPa, approximately 8.0 to approximately 10 GPa, approximately 10 to approximately 12.5 GPa, approximately 12.5 to approximately 15 GPa, approximately 15 to approximately 17.5 GPa, and approximately 17.5 to approximately 20 GPa. Optionally, the crack barrier layer 20 is made of a material having a Young's modules in a range of approximately 0.5 GPa to approximately 1.5 GPa, e.g., approximately 0.5 GPa to approximately 1.0 GPa and approximately 1.0 GPa to approximately 1.5 GPa.

Referring to FIG. 12D, subsequent to forming the crack barrier layer 20, an encapsulating layer 30 is formed on the base substrate 10 to encapsulate the at least one of a plurality of light emitting elements LE. As shown in FIG. 12 D, the encapsulating layer 30 is formed in each of the plurality of crack barrier regions R, thereby forming a plurality of encapsulated islands I respectively in the plurality of crack barrier regions R. Due to the presence of the barrier wall W, the encapsulating layer 30 can be formed into discontinuous parts, for example, each of the discontinuous parts discontinues at a position having the crack barrier layer 20. Thus, the encapsulating layer 30 can be formed in the display substrate without the need of a mask plate. e.g., the encapsulating layer 30 can be formed by depositing one or more encapsulating material on the entire surface of the display substrate. When the encapsulating layer 30 includes an inorganic sublayer, the inorganic sublayer is segregated into several discontinuous parts. Cracks in the inorganic sublayer outside the plurality of encapsulated islands I will not propagate into inside of each of the plurality of encapsulated islands I. As a result, the display substrate can be made to be highly moist-resistant and oxygen-resistant.

In another aspect, the present disclosure provides a display panel including a display substrate described herein or fabricated by a method described herein. In some embodiments, the plurality of light emitting elements are a plurality of organic light emitting diodes, and the display panel is an organic light emitting diode display panel. In some embodiments, the plurality of light emitting elements are a plurality of quantum dots light emitting diodes, and the display panel is a quantum dots light emitting diode display panel. In some embodiments, the plurality of light emitting elements are a plurality of micro light emitting diodes, and the display panel is a micro light emitting diode display panel.

In another aspect, the present disclosure provides a display apparatus including a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
a base substrate;
a crack barrier layer on the base substrate defining a plurality of crack barrier regions in the display substrate; and
a plurality of encapsulated islands on the base substrate and respectively in the plurality of crack barrier regions;
wherein each of the plurality of encapsulated islands comprises:
at least one of a plurality of light emitting elements; and
an encapsulating layer encapsulating the at least one of a plurality of light emitting elements and forming a lateral side of a respective one of the plurality of encapsulated islands;
wherein the crack barrier layer forms a barrier wall for preventing cracks in one or more sublayers of the display substrate outside the plurality of encapsulated islands from propagating into inside of each of the plurality of encapsulated islands; and
the barrier wall is spaced apart from the lateral side of the respective one of the plurality of encapsulated islands by a pap.

2. The display substrate of claim 1, wherein the barrier wall has a first side facing the base substrate, a second side substantially opposite to the first side and facing away the base substrate, a third side and a fourth side respectively connecting the first side and the second side;
the third side has a first average slope angle with respect to the first side greater than approximately 90 degrees; and
the fourth side has a second average slope angle with respect to the first side greater than approximately 90 degrees.

3. The display substrate of claim 2, wherein the first average slope angle is in a range of approximately 120 degrees to approximately 160 degrees; and
the second average slope angle is in a range of approximately 120 degrees to approximately 160 degrees.

4. The display substrate of claim 2, wherein the barrier wall has a height between the first side and the second side in a range of approximately 2 μm to approximately 6 μm.

5. A display substrate, comprising:
a base substrate;
a crack barrier layer on the base substrate defining a plurality of crack barrier regions in the display substrate;
a plurality of encapsulated islands on the base substrate and respectively in the plurality of crack barrier regions; and
a barrier layer on the base substrate and comprising a plurality of barrier blocks spaced apart from each other;
wherein each of the plurality of encapsulated islands comprises:
at least one of a plurality of light emitting elements; and
an encapsulating layer encapsulating the at least one of a plurality of light emitting elements and forming a lateral side of a respective one of the plurality of encapsulated islands;
wherein the crack barrier layer forms a barrier wall for preventing cracks in one or more sublayers of the display substrate outside the plurality of encapsulated islands from propagating into inside of each of the plurality of encapsulated islands; and
each of the plurality of encapsulated islands further comprises one of the plurality of barrier blocks on a side of the at least one of the plurality of light emitting elements distal to the encapsulating layer.

6. The display substrate of claim 5, wherein the encapsulating layer is in direct contact with each of the plurality of barrier blocks to encapsulate the plurality of light emitting elements.

7. The display substrate of claim 5, further comprising a planarization layer on the base substrate and comprising a plurality of planarization blocks spaced apart from each other;
wherein each of the plurality of encapsulated islands further comprises:
at least one thin film transistor on a respective one of the plurality of barrier blocks; and
a respective one of the plurality of planarization blocks on a side of the at least one thin film transistor distal to the respective one of the plurality of barrier blocks;
wherein the at least one of the plurality of light emitting elements is on a side of the respective one of the plurality of planarization blocks distal to the base substrate.

8. The display substrate of claim 7, wherein each of the at least one of the plurality of light emitting elements comprises a first electrode, a light emitting layer on the first electrode, and a second electrode on a side of the light emitting layer distal to the first electrode;
the display substrate further comprises a plurality of signal lines passing through underneath the barrier wall thereby connecting electronic components in adjacent encapsulated islands of the plurality of encapsulated islands; and
the second electrode is electrically connected to one of the plurality of signal lines through a via extending through the respective one of the plurality of planarization blocks.

9. The display substrate of claim 8, further comprising a pixel definition layer on a side of the planarization layer distal to the base substrate, and comprising a plurality of pixel definition blocks spaced apart from each other, each of the plurality of pixel definition blocks defining a pixel aperture;
wherein each of the plurality of encapsulated islands further comprises a respective one of the plurality of pixel definition blocks on a side of the respective one of the plurality of planarization blocks distal to the base substrate.

10. The display substrate of claim 1, wherein the crack barrier layer comprises a plurality of barrier enclosures spaced apart from each other;
each individual one of the plurality of barrier enclosures defines a respective one of the plurality of crack barrier regions; and
barrier walls of adjacent barrier enclosures of the plurality of barrier enclosures are spaced apart from each other by a gap.

11. The display substrate of claim 1, wherein the display substrate comprises three or more barrier walls of the crack barrier layer between adjacent encapsulated islands of the plurality of encapsulated islands, the three or more barrier walls spaced apart from each other by a gap.

12. The display substrate of claim 1, wherein a total number of the plurality of light emitting elements in each individual one of plurality of encapsulated islands is one.

13. The display substrate of claim 1, wherein the encapsulating layer comprises at least one inorganic encapsulating sublayer; and
the crack barrier layer is configured to prevent cracks in the at least one inorganic encapsulating sublayer outside the plurality of encapsulated islands from propagating into inside of each of the plurality of encapsulated islands.

14. The display substrate of claim 1, wherein the base substrate is a stretchable base substrate;
the display substrate is a stretchable display substrate having a substantially non-stretched state and a stretched state; and
the cracks in the one or more sublayers of the display substrate outside the plurality of crack barrier regions are cracks resulting from the display substrate transitioning between the substantially non-stretched state and the stretched state.

15. The display substrate of claim 14, wherein the barrier wall is in direct contact with the base substrate.

16. A display apparatus, comprising the display substrate of claim 1.

17. A method of fabricating a display substrate, comprising:
forming a crack barrier layer on a base substrate defining a plurality of crack barrier regions in the display substrate; and
forming a plurality of encapsulated islands on the base substrate and respectively in the plurality of crack barrier regions;

wherein forming each of the plurality of encapsulated islands comprises:

forming at least one of a plurality of light emitting elements; and forming an encapsulating layer encapsulating the at least one of a plurality of light emitting elements, the encapsulating layer forming a lateral side of a respective one of the plurality of encapsulated islands;

wherein the crack barrier layer is formed to constitute a barrier wall for preventing cracks in one or more sublayers of the display substrate outside the plurality of encapsulated islands from propagating into inside of each of the plurality of encapsulated islands; and the barrier wall is spaced apart from the lateral side of the respective one of the plurality of encapsulated islands by a gap.

18. The method of claim 17, wherein the encapsulating layer is formed by depositing an encapsulating material subsequent to forming the crack barrier layer.

19. The method of claim 17, wherein the crack barrier layer is formed to have an undercut profile; and the barrier wall is formed to have a first side facing the base substrate, a second side substantially opposite to the first side and facing away the base substrate, a third side and a fourth side respectively connecting the first side and the second side;

the third side has a first average slope angle with respect to the first side greater than approximately 90 degrees; and the fourth side has a second average slope angle with respect to the first side greater than approximately 90 degrees.

\* \* \* \* \*